(12) United States Patent
Reinprecht

(10) Patent No.: US 9,283,888 B2
(45) Date of Patent: Mar. 15, 2016

(54) MOTOR VEHICLE STATUS DISPLAY VISIBLE FROM OUTSIDE THE VEHICLE FOR THE STATE OF AN OPERATIONALLY RELEVANT COMPONENT

(71) Applicant: ZIZALA LICHTSYSTEME GMBH, Wieselburg (AT)

(72) Inventor: Markus Reinprecht, Wieselburg (AT)

(73) Assignee: ZIZALA LICHTSYSTEME GMBH, Wieselburg (AT)

( * ) Notice: Subject to any disclaimer, the term of this patent is extended or adjusted under 35 U.S.C. 154(b) by 0 days.

(21) Appl. No.: 14/379,251

(22) PCT Filed: Jan. 22, 2013

(86) PCT No.: PCT/AT2013/050018
§ 371 (c)(1),
(2) Date: Aug. 15, 2014

(87) PCT Pub. No.: WO2013/120120
PCT Pub. Date: Aug. 22, 2013

(65) Prior Publication Data
US 2015/0022335 A1    Jan. 22, 2015

(30) Foreign Application Priority Data

Feb. 16, 2012  (AT) .................................. A 197/2012
Feb. 24, 2012  (AT) .............................. A 50041/2012
Sep. 13, 2012  (AT) ................................ A 1004/2012

(51) Int. Cl.
*G08B 21/00* (2006.01)
*B60Q 1/50* (2006.01)
*B60Q 1/00* (2006.01)
*G08B 5/36* (2006.01)
*H05B 33/08* (2006.01)
*B60L 3/00* (2006.01)
*B60L 11/18* (2006.01)
*G01R 31/36* (2006.01)

(52) U.S. Cl.
CPC .............. *B60Q 1/50* (2013.01); *B60L 3/0023* (2013.01); *B60L 11/1861* (2013.01); *B60Q 1/0011* (2013.01); *G08B 5/36* (2013.01); *H05B 33/083* (2013.01); *H05B 33/0854* (2013.01); *H05B 33/0872* (2013.01); *B60L 2240/54* (2013.01); *B60L 2250/16* (2013.01); *G01R 31/3689* (2013.01)

(58) Field of Classification Search
CPC ........................................................ B60Q 1/50
USPC ........... 340/463–479, 815.45; 315/77, 185 R, 315/193, 291; 362/487
See application file for complete search history.

(56) References Cited

U.S. PATENT DOCUMENTS

| | | | |
|---|---|---|---|
| 3,796,951 A | 3/1974 | Joseph | |
| 2011/0198999 A1* | 8/2011 | Honma | B60Q 1/12 315/77 |

FOREIGN PATENT DOCUMENTS

| | | |
|---|---|---|
| EP | 0935091 A1 | 8/1999 |
| EP | 1903358 A1 | 3/2008 |
| EP | 2317212 A1 | 5/2011 |
| EP | 2337428 A2 | 6/2011 |
| WO | 2007/069124 A1 | 6/2007 |
| WO | 2010/046806 A1 | 4/2010 |
| WO | 2011/096680 A2 | 8/2011 |

OTHER PUBLICATIONS

1st Office Action dated Feb. 11, 2013 of patent application No. 197/2012.
Search Report of corresponding International Patent Application No. PCT/AT2013/050039, dated Aug. 21, 2013.
1st Office Action dated Jan. 18, 2013 of patent application No. A 50041/2012.
Search Report of corresponding International Patent Application No. PCT/AT2013/050041, dated Aug. 26, 2013.
Search Report of International Patent Application No. PCT/AT2013/050018, dated Aug. 19, 2013.

* cited by examiner

*Primary Examiner* — Jeffery Hofsass
(74) *Attorney, Agent, or Firm* — Sutherland Asbill & Brennan LLP

(57) ABSTRACT

A status display for the state of an operationally-relevant component (1) of a motor vehicle, in which an illuminating structure (4) supplied by at least two light sources (5, 6) is arranged in a position of the vehicle which is visible from the outside and a control circuit (3) which is associated with the light sources is designed to control the light sources in accordance with a state signal ($s_z$) representing the state of the operationally-relevant component (1), such that the luminance and/or the color indicates, along the illuminating structure and in a scaled manner, the state of the component.

5 Claims, 7 Drawing Sheets

Figure 1:
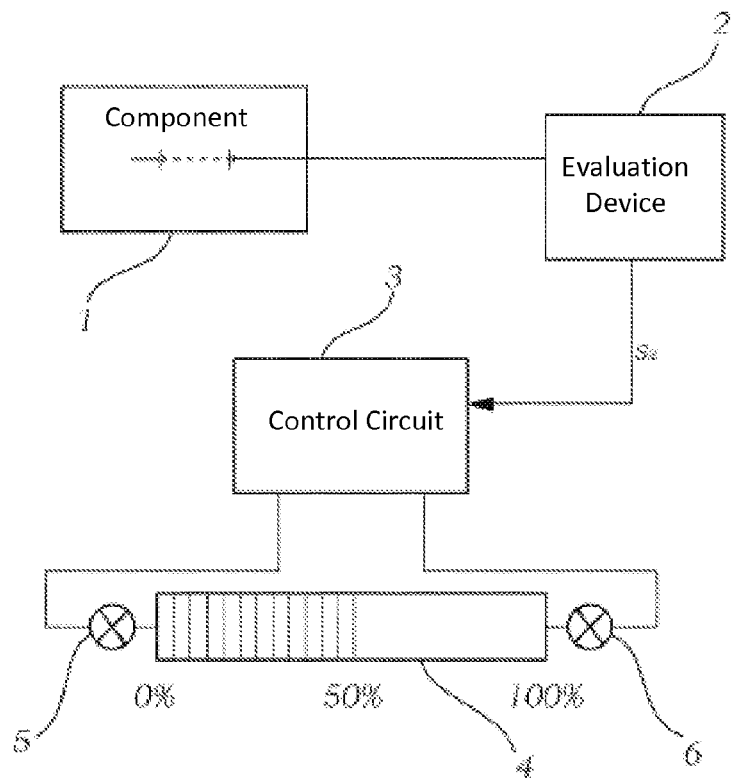

MOTOR VEHICLE STATUS DISPLAY VISIBLE FROM OUTSIDE THE VEHICLE FOR THE STATE OF AN OPERATIONALLY RELEVANT COMPONENT

The invention relates to a status display for the state of an operationally-relevant component of a motor vehicle.

For the user of a motor vehicle it is essential to quickly obtain information concerning the state of certain components of the vehicle, wherein such components are referred to as "operationally-relevant" in conjunction with the invention. Examples of such states of components include the state of charge of an accumulator battery of an electric or hybrid vehicle or the fill level of a fuel tank, the tyre pressure, the engine temperature, etc. Such states are usually only visible once the user has taken his seat in or on the vehicle and usually only following actuation of a (ignition) switch.

Lights, whether these be headlights, indicator lights, brake lights, etc., which are often activated when the vehicle is opened by means of a remote control, can usually be seen externally on a motor vehicle.

The object of the invention is to make the aforementioned states of operationally-relevant components of a motor vehicle visible externally to a user, for example already when the user approaches a vehicle, where appropriate following actuation of a remote control.

In order to solve this problem, in the case of a status display for the state of an operationally-relevant component of a motor vehicle, the invention proposes arranging an elongate illuminating structure, supplied by at least two light sources, in a position of the vehicle which is visible from the outside and associating a control circuit with the light sources, the control circuit being designed to activate the light sources in accordance with a state signal representative of the state of the operationally-relevant component, such that the luminance and/or colour along the illuminating structure indicates the state of the component in a scale-like manner.

Thanks to the invention, it is also possible with use of illuminating structures provided in any case on the motor vehicle to immediately inform the user of certain states, particularly critical states. If, for example, it is indicated to the user that the accumulator battery of his electric vehicle is empty or almost empty, the user will not even enter his vehicle, but will ensure that the battery is charged.

In an expedient variant, the illuminating structure may have two or more light sources associated with the structure, since a multiplicity of practice-oriented developments are created by selection of the position and formation of the light sources.

Further, the illuminating structure can be formed advantageously as a reflector matrix, especially since a reflector matrix is a component of a lighting unit that is often already provided.

A particularly expedient variant is characterised in that the illuminating structure is formed as a light stick. Light sticks can be formed so as to be extremely variable, specifically in terms of their shape and length, and can therefore be used in a versatile manner.

In a further variant, each light source may have at least one light-emitting diode, and each light-emitting diode may be associated with a control circuit, which has a series circuit of a reference voltage sink of the voltage and of a controlled switch, which series circuit is connected in parallel with the light-emitting diode and is designed to compare the control voltage across a control line common to all control circuits measured toward a base of the LED series circuit with the voltage at the connection of the switch to the subsequent LED in the chain or to the base and to close or open the switch if the control voltage falls below a predefined value or rises above a predefined value respectively. With such an embodiment, the wiring complexity for the light-emitting diode chain is minimal.

In another variant of the invention, the illuminating structure has at least one light stick having at least two light feed positions, which are each associated with a light source, wherein the optical waveguide is designed to guide the supplied light and to irradiate light on account of defects formed on the optical waveguide, and the control circuit is designed to activate the light sources at the two light feed positions in accordance with the state of the component. Such a light stick can be integrated easily into provided illuminating means for example, without having a detrimental effect on the aesthetics.

In many cases the display can be formed in a much more meaningful manner if the light sources irradiate a different colour.

It is furthermore often recommended, in view of energy demand and heat generation, if the light sources are formed as light-emitting diodes.

Compact and cost-effective embodiments are also achieved if the illuminating structure of the status display is arranged in/on a headlight unit of the motor vehicle.

Figure 5:
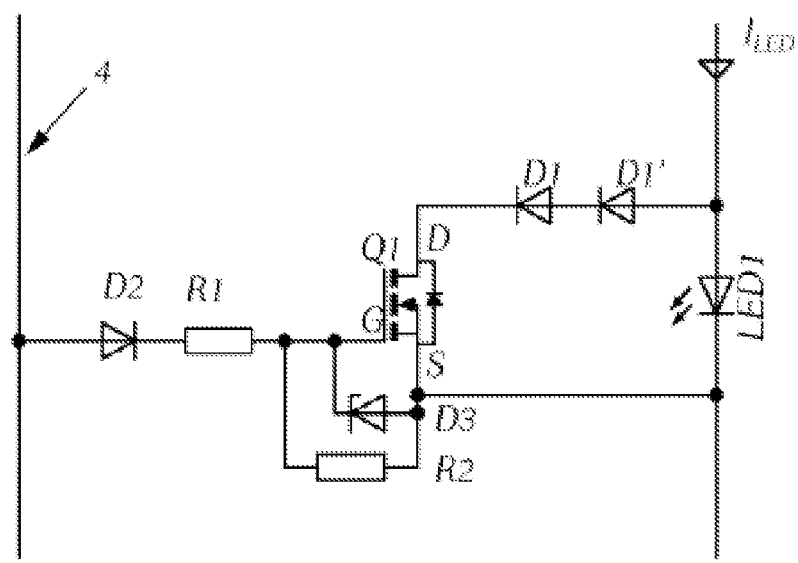
Figure 2:
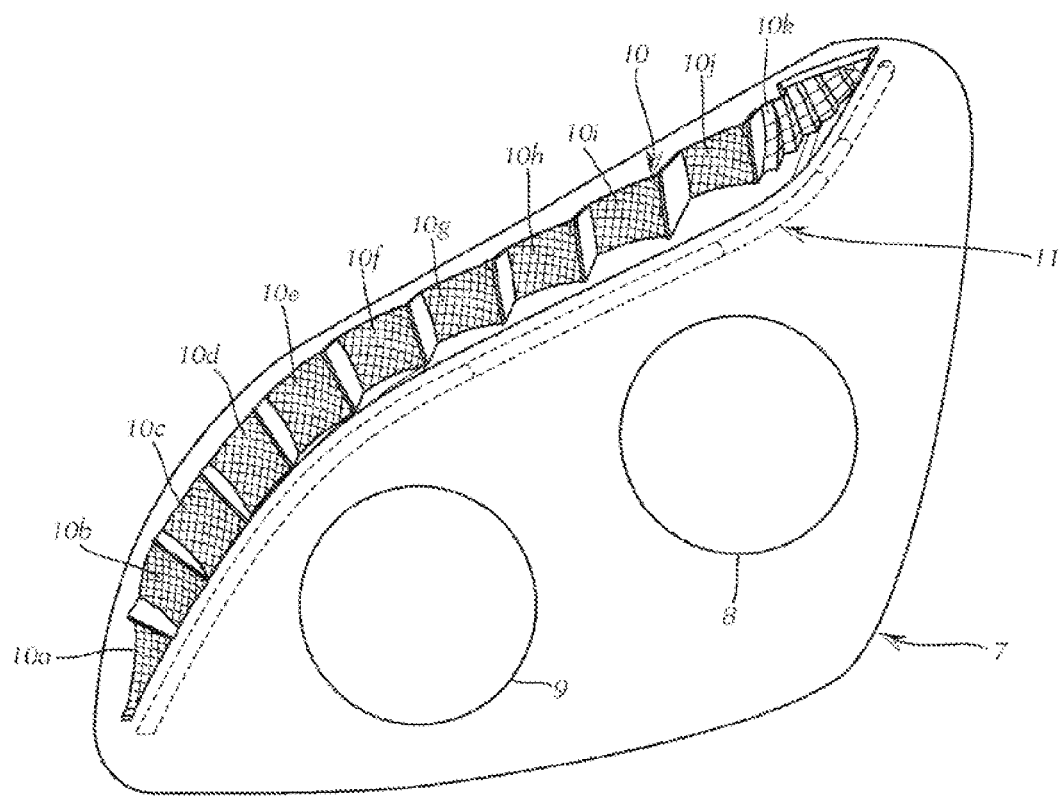
Figure 3:
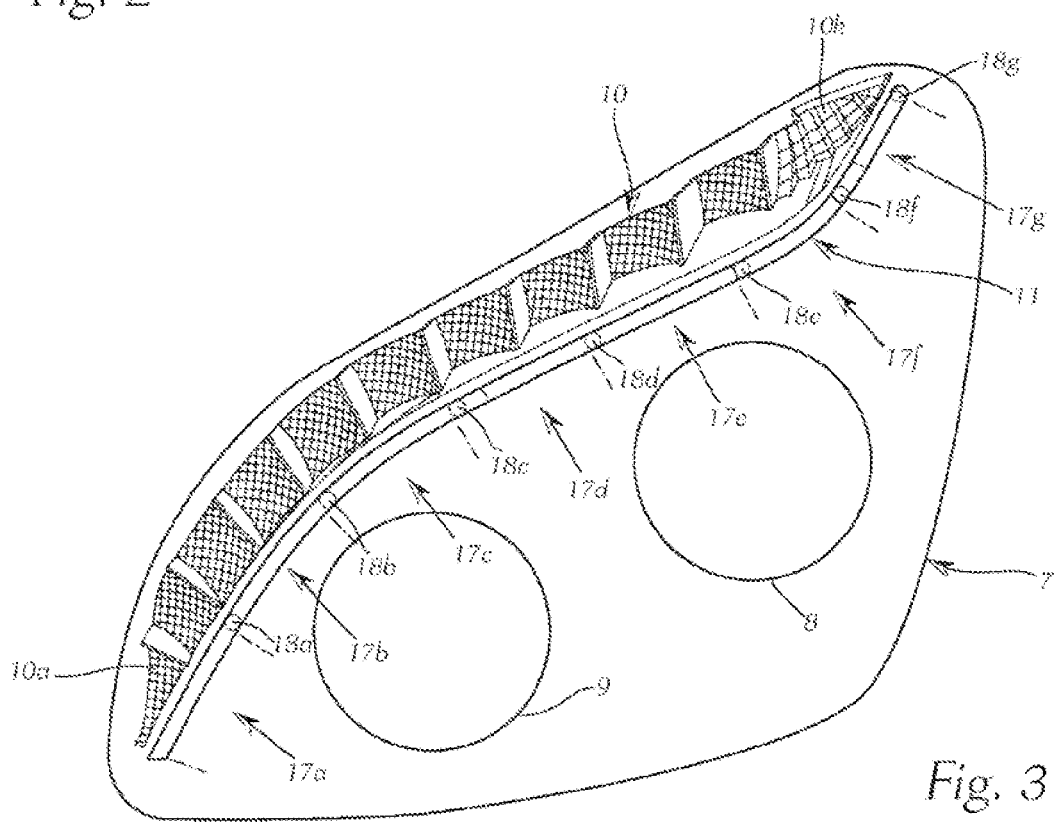
Figure 4:
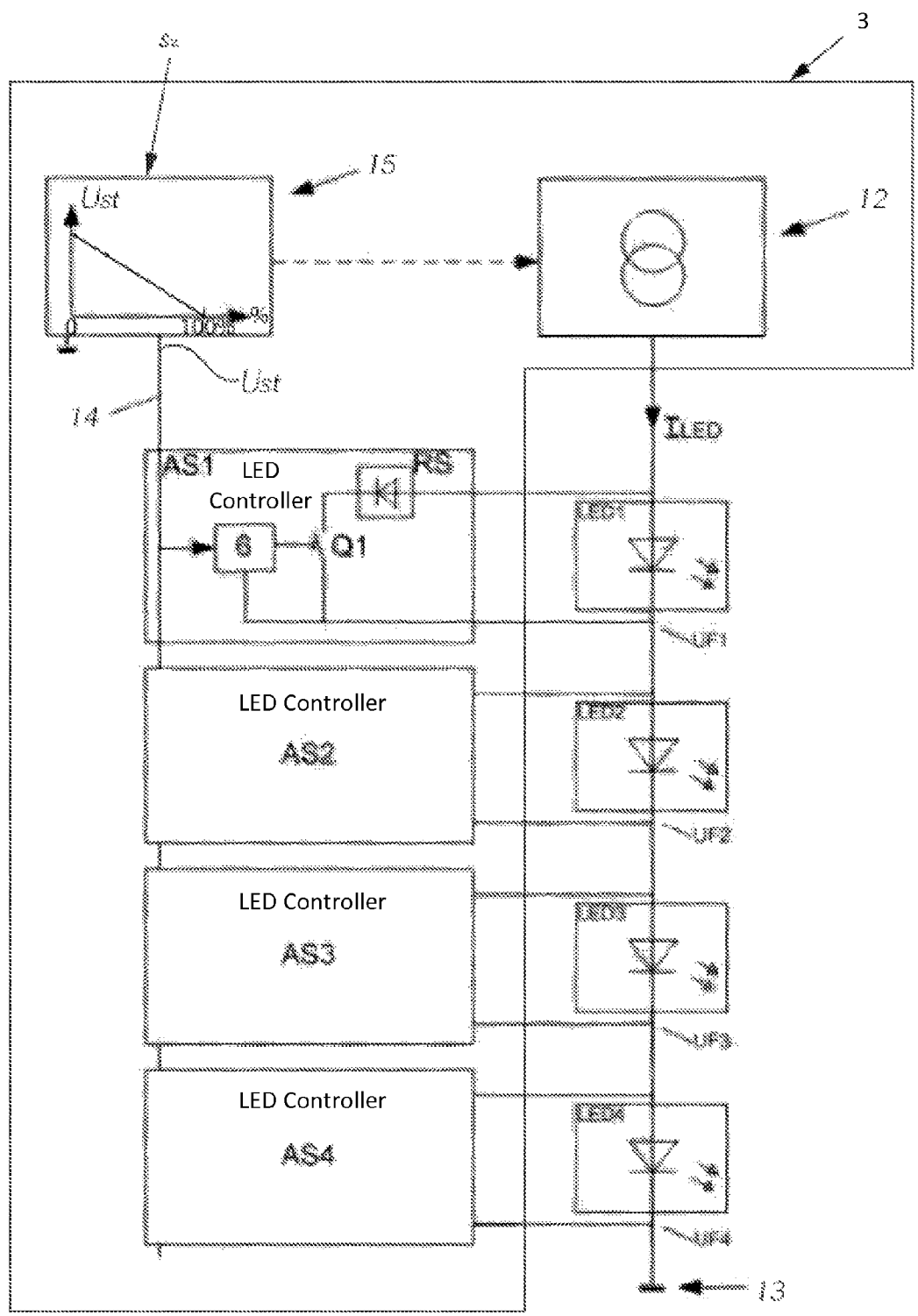
Figure 6:
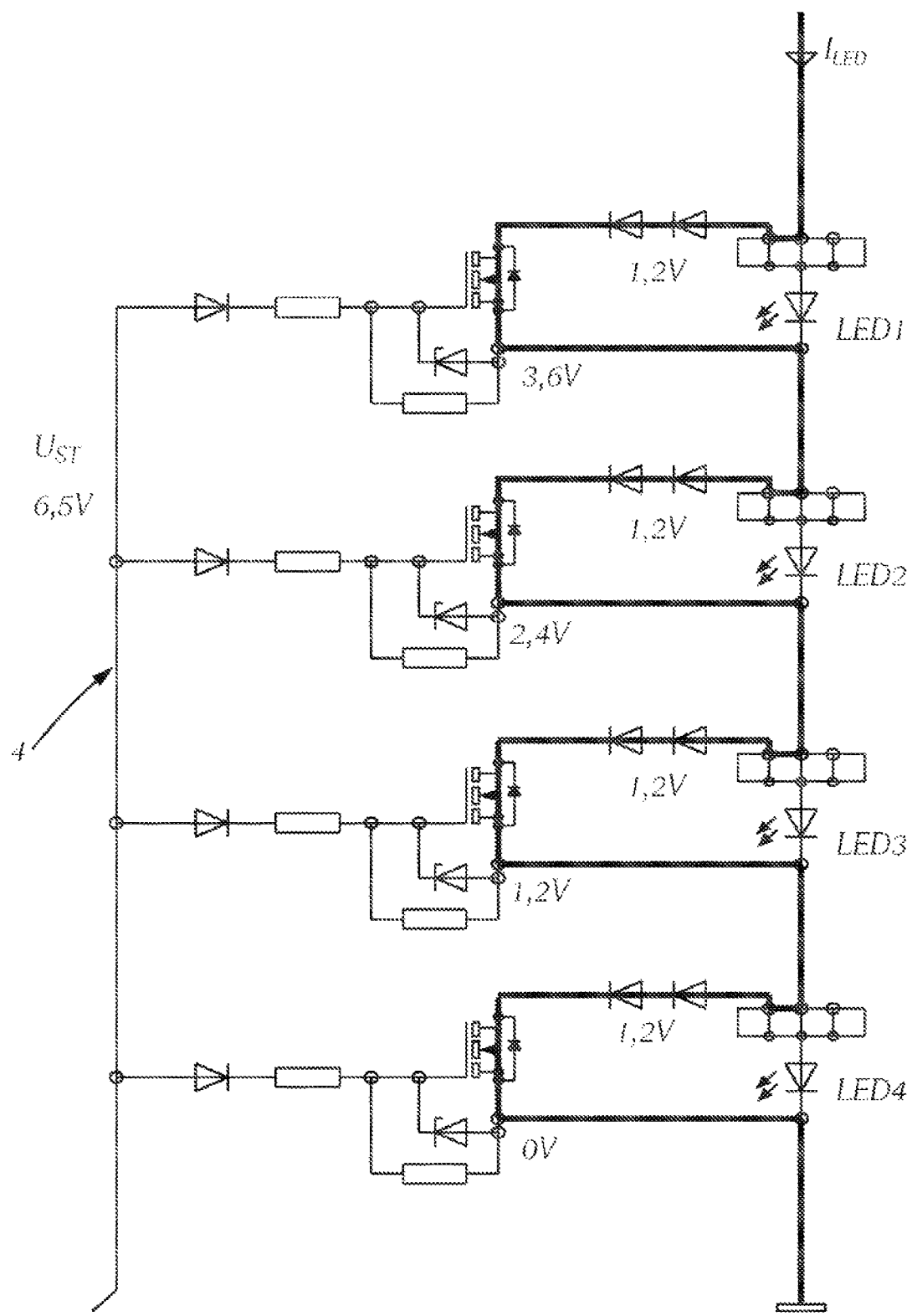
Figure 7:
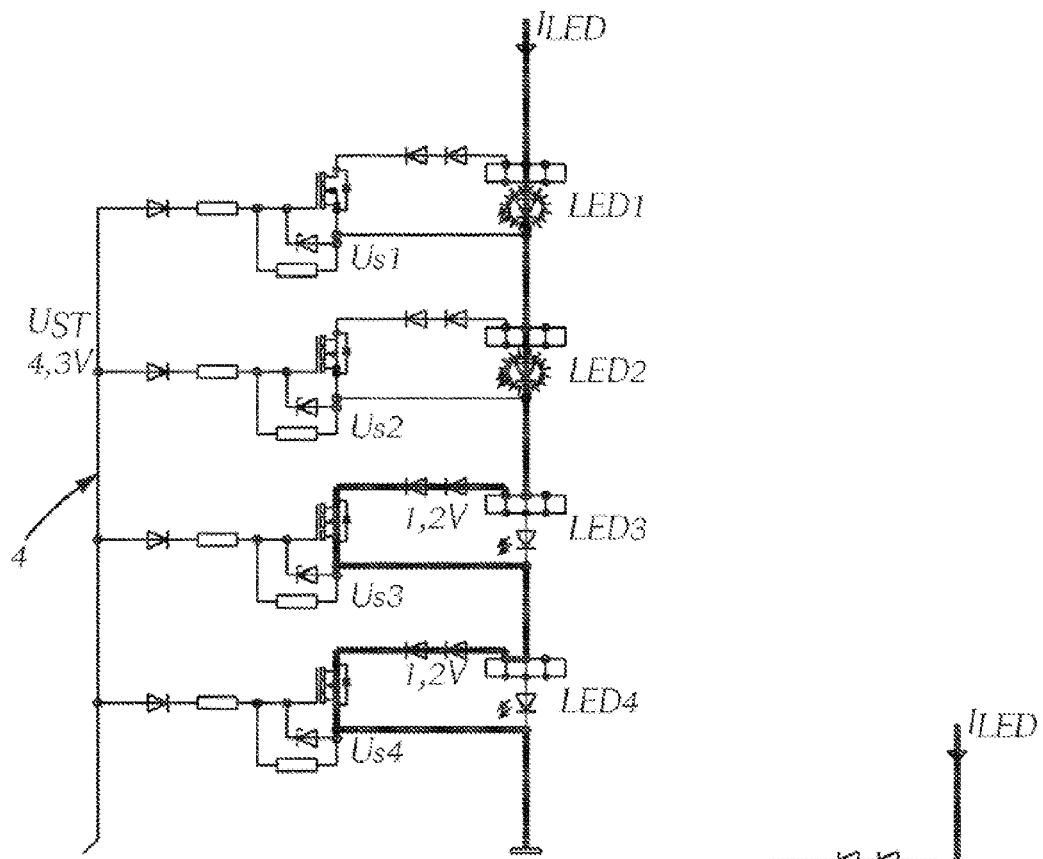
Figure 8:
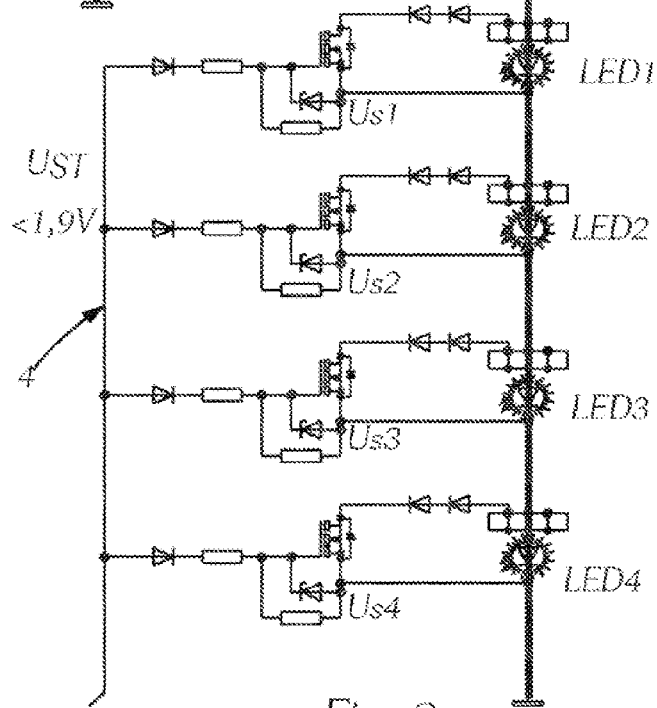
Figure 9A:
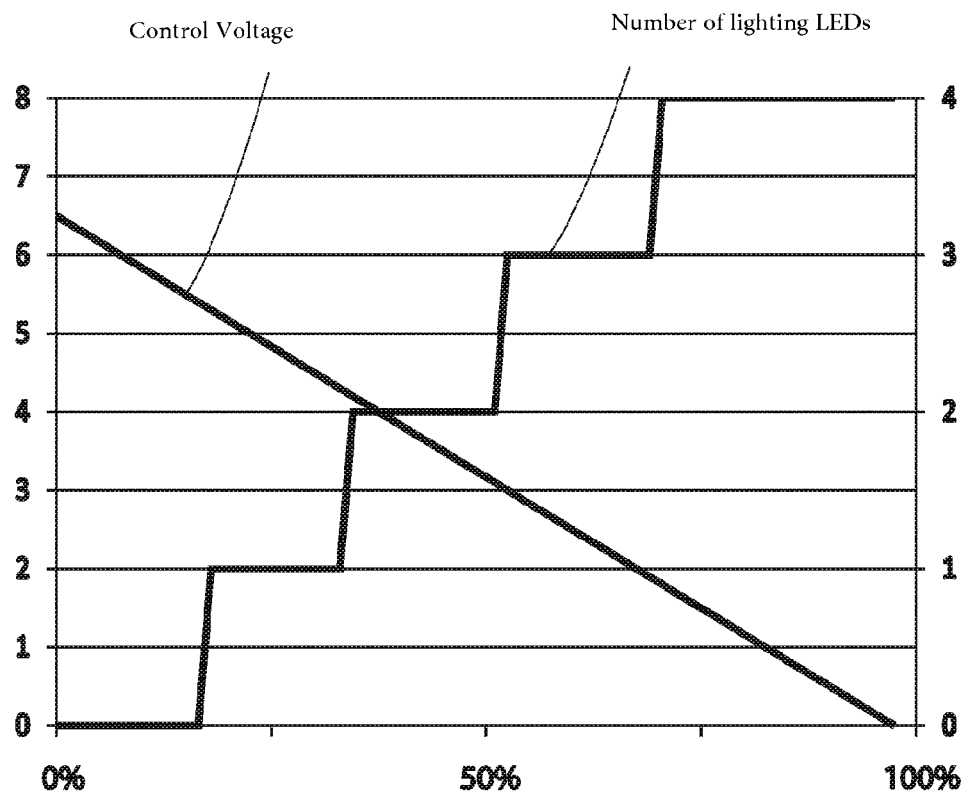
Figure 9B:
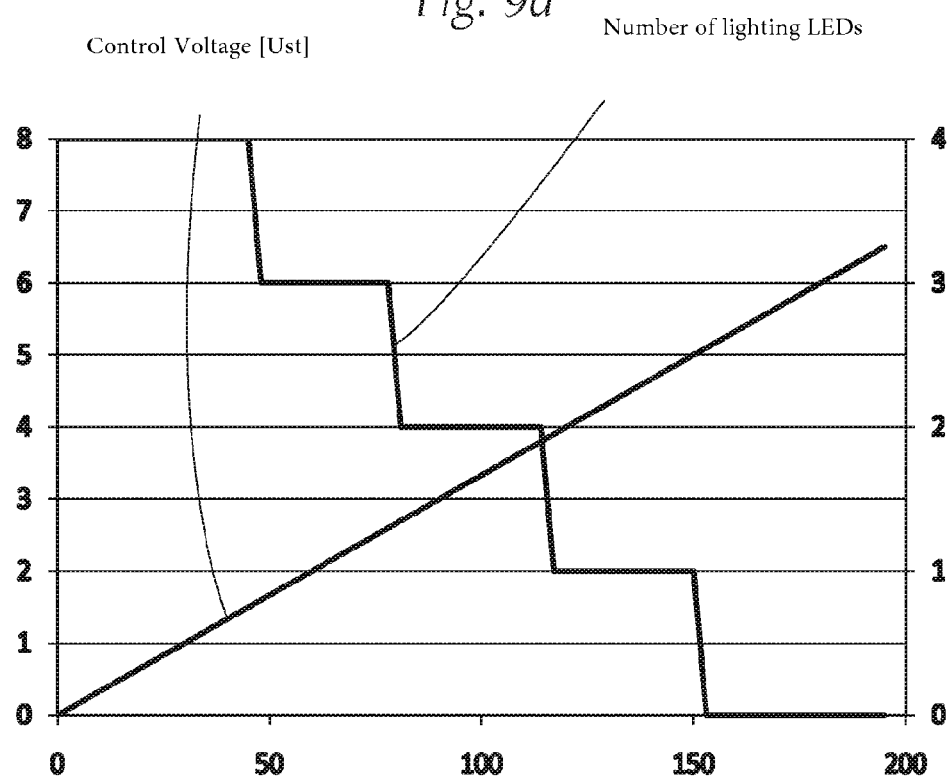
Figure 10:
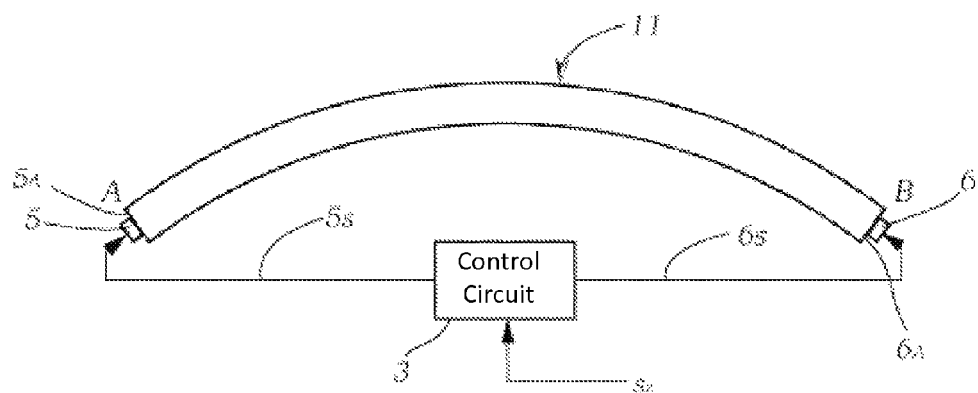
Figure 11:
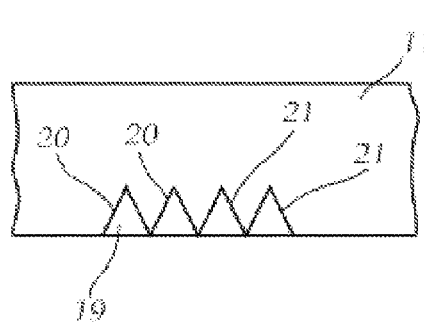

The invention inclusive of further advantages is explained in greater detail hereinafter on the basis of exemplary embodiments, which are illustrated in the drawing, in which FIG. 1 schematically shows the activation of the illuminating structure of a status display according to the invention, FIG. 2 shows an embodiment of the invention with arrangement of an illuminating structure in a front headlight, as viewed schematically from the front, FIG. 3 shows a variant similar to the embodiment according to FIG. 2, FIG. 4 shows, in a block diagram, the basic structure of a light-emitting diode chain for an illuminating structure according to the invention, FIG. 5 shows the circuit diagram of an LED controller of a light-emitting diode in a light-emitting diode chain, FIGS. 6 to 8 show various operating states of an exemplary light-emitting diode chain comprising four light-emitting diodes, FIG. 9a and FIG. 9b show graphs illustrating the time curve of a falling and rising control voltage respectively and also the number of illuminating light-emitting diodes in a chain comprising four light-emitting diodes, FIG. 10 schematically shows a light stick activated at its two ends, FIG. 11 shows the view of a portion of an optical waveguide used in the case of the invention, and FIGS. 12a and 12b by way of example show intensity states of the two light sources at the ends of the light stick of FIG. 10.

According to FIG. 1, the state of a component 1 relevant for the operation of a motor vehicle (not shown in greater detail here) is detected by an evaluation device 2, which outputs a state signal sz. The component 1 in the present example is the accumulator battery of an electric or hybrid vehicle and the evaluation device detects the current state of charge of the battery, wherein the state signal sz indicates the state of charge. The component 1, however, may also be the fuel tank of a vehicle, wherein the evaluation device detects the fill level of the tank. Other state signals could be the coolant/oil temperature of an engine of the vehicle, etc.

The state signal sz activates an elongate illuminating structure 4 via a control circuit 3, the illuminating structure having at least two light sources 5, 6. The control circuit is designed to activate the light sources such that the luminance and/or colour along the illuminating structure 4 indicates the state of the component in the manner of a scale in accordance with the state of the operationally-relevant component, for example in accordance with the state of charge of the accumulator battery. By way of example in FIG. 1, 0% (empty battery) is assumed at the left-hand end of the illuminating structure and 100% (full battery) is assumed at the right-hand end, wherein, in FIG. 1, an approximately 50% state of charge is assumed, the structure 4 being lit up halfway, starting from the left. The illuminating structure 4 can be lit up in the simplest case with white light or monochromatically, however it is also possible to generate, for example, a green/red transition by using coloured light sources, the transition "changing" depending on the state of the component. A person skilled in the art is provided with many implementation possibilities for forming such a light scale, wherein exemplary embodiments will be explained further below.

Furthermore in accordance with the invention, the illuminating structure is arranged in a position of the motor vehicle which is visible from the outside. The term "visible from the outside" is to be understood to the extent that the status display according to the invention for example is not provided, as is usually the case, in the dashboard or otherwise in the direct field of vision of the driver, but on the outside of the vehicle or in any case so as to be visible from the outside. Possible examples for an embodiment are strips on the outside of a car body or an integration in vehicle lights already provided, whether these be headlights, brake illuminating structures or the like.

Two exemplary embodiments with regard to the arrangement of status displays according to the invention in front headlights are shown in FIGS. 2 and 3, wherein, in both cases, a headlight unit 7 for example contains a dipped light unit 8 and a main beam light unit 9. Further, a reflector matrix 10 and a light stick 11 are arranged in the headlight, here above the units 8 and 9 and running at an incline. The reflector matrix 10 and the light stick 11 for example are slightly curved or undulating in accordance with design specifications.

The reflector matrix 10, which in the shown example has eleven reflector fields 10a ... 10k, which can each be lit up by an LED (not visible in greater detail) or by a plurality of LEDs, is used for example as an indicator light, daytime running light, position light. The light stick 11 arranged optionally below the reflector matrix 10 and denoted by a dashed line can be supplied at two or more points by LEDs and for example can be used as a position light or for other purposes.

In the embodiment according to FIG. 2, the reflector matrix 10 with its eleven reflector fields is also used as an illuminating structure for the status display according to the invention. By way of example, more or fewer reflector fields 10a ... 10k are illuminated from left to right in the sense of a scale by the light sources associated therewith in accordance with the state of charge of an accumulator battery or the fill level of a fuel tank. An example of one of many possible control variants will be given hereinafter for four light sources.

FIG. 4 shows the structure of a light-emitting diode chain for an illuminating structure according to the invention: a power source 12 delivers a current ILED and supplies, in this example, four light-emitting diodes connected in series LED1 to LED4 toward a base or ground point 13 by means of the control circuit 3. These four light-emitting diodes can be associated for example with a reflector matrix similarly to the reflector matrix 10 according to FIG. 2, wherein such a matrix would have just four reflector fields and not eleven as is the case according to FIG. 2

Each light-emitting diode LED1 ... LED4 is associated with an LED controller AS1 to AS4, which has a series circuit of a reference voltage sink RS of the voltage Uref and of a controlled switch Q, which series circuit is connected in parallel with the associated light-emitting diode.

A control line 14 common to all LED controllers AS1 to AS4 is arranged at the output of a ramp generator 15, to which the state signal sz is fed, and is connected via a comparator circuit 6 (illustrated here symbolically) of the LED controllers to the control inputs of the controlled switches. Here, each LED controller is designed to compare a control voltage Ust, which is present across the control line 14, measured toward a base 13, with the voltage UF1 to UF4 across the connection of the circuit Q to the subsequent light-emitting diode LD2 in the chain or to the base 13 and to open the switch Q if the control voltage Ust falls below a predefined value and to close the switch Q if the control voltage Ust rises above a predefined value. On the whole, the number of lit LEDs becomes greater with falling control voltage. In the symbolic diagram in the block 15 of the ramp generator, the control voltage Ust is therefore plotted by way of example on the ordinate and a rising state of charge of an accumulator battery is plotted on the abscissa.

The light-emitting diodes LED1 ... LED4 of the light-emitting diode chain do not necessarily have to be individual light-emitting diodes, but series and/or parallel circuits of light-emitting diodes can be provided instead of a light-emitting diode. A line denoted by a dashed line between the ramp generator 15 and the power source 12 is intended to indicate that an additional control of the current ILED can be implemented where appropriate.

Since all LED controllers are formed identically, an exemplary embodiment of an LED controller that has been tested in practice will be described in detail hereinafter with reference to FIG. 5 and can be associated with the first light-emitting diode LED1 in the chain.

The series circuit of two diodes connected in the forward direction, which are denoted on the whole by D1 and which form a reference voltage sink, is arranged in parallel with the light-emitting diode LED1 with the switching path D-S of a MOSFET Q, of which the source S is arranged at the cathode of the light-emitting diode LED1 and of which the drain D is arranged at the cathode of the diode(s) D1. The gate of the transistor Q is arranged on the control line 14 via the series circuit of a protective resistor R1 and an isolation diode D2. The source S and gate G of the MOSFET Q are bridged on the one hand by a Zener diode D3 and on the other hand by a resistor R2.

The isolation diode D2 prevents feedback onto the other circuits of the light-emitting diode chain, and the protective resistor R1, in combination with the Zener diode D3, prevents dangerously high voltages at the gate-source path of the MOSFET. The resistor R2 ensures that the MOSFET switch can be switched off in spite of the presence of the diode D2. The diode D1 is additionally used to compensate for the unavoidable gate-source voltage tolerances of the MOSFET Q1 and to take into account the fact that an FET does not have an exact switching point.

The voltage values provided hereinafter are to serve merely for improved explanation of the function of the invention and are dependent on the components used and the circuit dimensioning. In the shown exemplary embodiment, the two diodes forming the reference voltage diode D1 are Schottky diodes by way of example with a typical forward voltage in each case of 0.6 volts, such that the reference voltage Uref of the reference voltage sink D1 at nominal current of the light-emitting diodes is 1.2 volts. The Zener voltage of the Zener diode D3 is 8.2 volts and the forward voltage of the diode D2 is 0.6 volts. The MOSFET Q is typically conductive from a gate-source voltage of 2 volts. The forward voltage of the light-emitting diodes is typically 2 volts.

With further reference to FIGS. 6 to 8, the function of a four-stage light-emitting diode chain will now be explained, wherein it is clear to a person skilled in the art that the invention is in no way limited to a certain number of light-emitting diodes and that more or fewer than four stages can be provided with appropriate dimensioning. Just two of the four possible states of the light-emitting diode chain will be explained below.

In a first phase according to FIG. 6, the control voltage Ust is 6.5 volts. The voltage at the connection of the switch Q to the subsequent LED in the chain and to the base is 3.6 volts, 2.4 volts, 1.2 volts and 0 volts respectively. The gate-source voltage of each MOSFET is greater than 2 volts, specifically 2.3 volts, 3.5 volts, 4.7 volts and 5.9 volts for the first to fourth stage, and therefore all MOSFETs Q are activated and their drain-source voltage is approximately at 0 volts. A voltage of 1.2 volts is present at each of the light-emitting diodes LED1 to LED4, substantially in accordance with the reference voltage URef. This voltage is significantly lower than the forward voltage of the light-emitting diodes of 2 volts, and it does not light any light-emitting diodes. In the graphs of FIG. 9, this corresponds to the starting point of the falling voltage ramp.

In FIG. 7 the control voltage Ust has fallen to 4.3 volts, the gate-source voltage of the MOSFET of the first stage is still only 0.1 volts, that of the MOSFET of the second stage is still only 1.3 volts, and therefore, besides the switch Q1 of the first stage, the switch of the second stage also closes and the second light-emitting diode LED1 also illuminates, as does the first light-emitting diode LED2.

In the phase shown in FIG. 8, all light-emitting diodes LED1 to LED4 illuminate, since the gate-source voltages at the MOSFETs of the individual stages (from top to bottom in the drawing) are now 0 volts, 0 volts, 0 volts and 1.3 volts with a control voltage Ust of below 1.9 volts.

For the source voltages $Us_1$, $Us_2$, $Us_3$ and $Us_4$, no specific values are specified in FIGS. 7 and 8, and in addition the voltage $Us_1$ in FIG. 7 and the voltages $Us_1$, $Us_2$ and $Us_3$ in FIG. 8 are determined by the forward voltages of the provided LEDs, which are type- and power-dependent.

On the whole, the described operating principle with, for example, a linearly falling control voltage USt generated by the ramp generator 5 causes a continuous light exposure "filling" the light-emitting diode chain. To this end, reference is again made to FIG. 9a, which demonstrates this operating principle for a period of time of 200 ms. As already mentioned, the curve of the control voltage may also follow other arbitrary functions instead of a linear function Of course, an opposite curve occurs with rising control voltage. This is illustrated in FIG. 9b, wherein again the fill state of an accumulator is plotted on the abscissa.

The possibility already discussed above of controlling the power source 12 to a certain extent by means of the ramp generator 15 such that further effects can be attained, for example a rising brightness of the light-emitting diodes as the chain is "filled", is not illustrated in detail.

The shown control possibility has the advantage that, irrespective of the number of used LEDs, merely three lines are necessary for the light-emitting diode chain. The simple and inexpensive control circuit can be constructed in the smallest space in the direct vicinity of the light-emitting diode. Of course, the light-emitting diodes can also be controlled directly, that is to say without the individual LED controllers, in another known manner if the number of required lines does not play a significant role.

Reference will now be made again to FIG. 3, which illustrates an embodiment in which, in conjunction with the invention, the reflector matrix 10 is not used, but instead the light stick 11. In the illustrated example, this light stick, which can additionally be used as an indicator light, position light and daytime running light, has seven light-up zones $17a \ldots 17g$, wherein each light-up zone is lit up at a coupling-in point $18a \ldots 18g$, as described below in greater detail, by a light source, for example by one or more LEDs in each case.

The light sources are controlled analogously by the control circuit 3, wherein a longer or shorter region of the light stick 11 is lit up in the sense of a scale in accordance with the state of the operationally-relevant component. Although in FIG. 3 seven coupling-in points for seven light sources are shown, it is possible to achieve a meaningful illumination with just two, preferably dimmable light sources, which irradiate at the two ends of a light stick.

Light sticks are used increasingly in automotive engineering, wherein light, for example from light-emitting diodes, is supplied at an end face into a light stick. The light is totally reflected inside on the delimiting walls of the optical waveguide, which usually has a circular cross section, but also possibly has a different cross section, for example an elliptical or rectangular cross section, however light is deflected at the defects, which for example are prism-like, and is substantially irradiated on the side opposite the defects. An example for such an optical waveguide structure has been known from EP 0 935 091 A1. This document concerns a rod-shaped optical waveguide, in which light-deflecting prisms provided over the entire length as defects in order to attain a uniform luminance have a width transversely to the rod axis that increases starting from the light coupling-in face, wherein an embodiment is also described in which a light coupling-in face and accordingly two light sources are provided at both ends of the optical waveguide.

The illuminating structure according to FIG. 10 formed as a light stick 11 shows a slightly curved optical waveguide, which at each of its two ends at a light feed position A and B has a light source 5 and 6 respectively, which can radiate light into a light entry face 5A, 6A. Each of the two light sources 5, 6 is supplied via feed lines 5s, 6s from the control circuit 3, to which the state signal sz is fed. LEDs are preferably used as light sources, however other light sources, such as incandescent lamps, xenon lamps, etc., can also be used.

FIG. 11 shows an enlarged portion of the light stick 11, on which a structure formed from defects 19 can be seen. Here, the defects formed as prisms each have two light face sides, specifically light face sides 20 and light face sides 21 in each case. It is thus possible for light supplied from both sides of the light stick 11 to be actually irradiated, substantially on the side of the light stick opposite the defect structure.

The light sources used within the scope of the invention in no way have to irradiate white light and do not have to be monochromatic, rather light sources with variable colours (RGB light sources) can also be used. Here, it is possible, for example, to generate a colour transition from red to green.

Figure 12A:
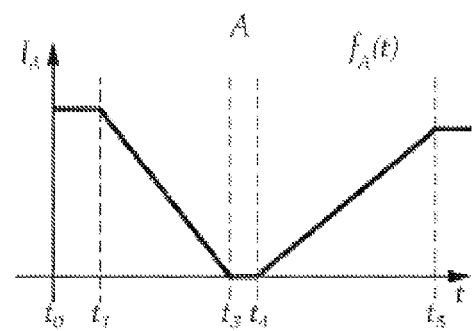
Figure 12B:
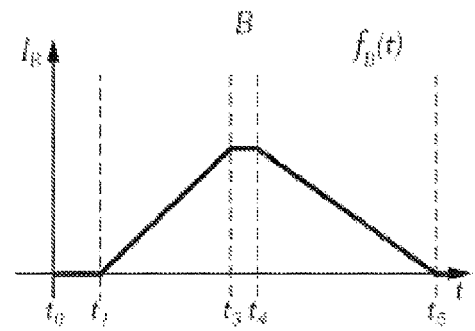

Reference will now be made to FIGS. 12a and 12b, which show graphs illustrating possible states of the intensity of the light sources 5 and 6 predefined by the control circuit 3 at the supply positions A and B, wherein the shown curves can also be referred to as dim curves.

The intensity IA of the first light source 5 at the position A starts for example from a certain maximum value, which can be defined arbitrarily. This is followed by a falling dim ramp, wherein this is illustrated linearly here as an example, however other curve shapes are possible for all dim ramps described here, the course of said curves being dependent on the change in state of the component. Here, the intensity of the light source at position A reduces up to a minimum value in order to then rise linearly here in accordance with a rising dim ramp. At the end of the rising dim ramp, the light source 5 has again reached a maximum brightness at the position A.

If the intensity curve of the second light source 6 is considered at the position B, it can be seen that in this example the second light source is controlled such that the brightness curve is exactly opposed to that of the first light source 5 at the position A. This type of control makes sense with differently coloured light sources, since the effect that light of position A (for example green) migrates from the light of position B (for example red) is thus created. With assumption of these colours of the two light sources, the colour green illuminates in a first state region B1 of the light stick, that is to say a viewer, in the example of an accumulator battery, would be shown a full state of charge thereof. In the state region B2, the light stick on the other hand would illuminate in the colour red and would show the viewer that the state of charge is equal to zero. Between these extreme regions, the proportion of the illuminating area or length is indicated by the ratio of the intensities of the two light sources 5, 6 at the points A, B, in accordance with intermediate stages of the state of charge of an accumulator battery in this example.

If, in the shown examples, a certain number of light sources is described and illustrated, it should be clear to a person skilled in the art that these numbers are in no way to be interpreted as limiting. By way of example, the embodiment according to FIGS. 4 to 8 can have a number of light-emitting diodes greater than four. Also, the illuminating structure does not in any way necessarily have to be elongate, rather illuminating structures with a different geometry, such as rings, circles with illuminated sectors, etc., can also be considered.

The invention claimed is:

1. A status display for a state of an operationally-relevant component of a motor vehicle, the status display comprising:
   an illuminating structure arranged in a position of the vehicle that is visible from outside the vehicle, the illuminating structure comprising:
   at least two light sources, and
   a control circuit, which is designed to control the at least two light sources in accordance with a state signal (sz) representing the state of the operationally-relevant component, such that the luminance and/or colour along the illuminating structure indicates the state of the component in a scale-like manner; and
   at least one light stick having at least two light feed positions (A, B), which are each associated with one of the at least two light sources,
   wherein the light stick is designed to guide the supplied light and to irradiate light on account of defects formed on the light stick, and the control circuit is designed to activate the at least two light sources at the at least two light feed positions in accordance with the state of the component.

2. The status display according to claim 1, wherein the light sources are formed as light-emitting diodes.

3. The status display according to claim 1, wherein each light source has at least one light-emitting diode and each light source is associated with a control circuit, which has a series circuit of a reference voltage sink of the voltage (Uref) and of a controlled circuit,
   wherein the series circuit is connected in parallel with the light-emitting diode and is designed to
   (i) compare the control voltage (Ust) measured across a control line common to all controllers toward a base of the LED series circuit with the voltage across the connection of the switch to the subsequent LED in the chain or to the base, and
   (ii) close or open the switch if the control voltage (Ust) falls below a predefined value or rises above a predefined value respectively.

4. The status display according to claim 1, wherein the at least two light sources irradiate a different colour.

5. The status display according to claim 1, wherein the illuminating structure is arranged in or on a headlight unit of the motor vehicle.

* * * * *